United States Patent
Ichimura et al.

(10) Patent No.: US 6,696,218 B2
(45) Date of Patent: Feb. 24, 2004

(54) CHEMICAL AMPLIFICATION TYPE POSITIVE RESIST COMPOSITION

(75) Inventors: Kunihiro Ichimura, 2-13-7, Kirigaoka, Midori-ku, Yokohama-shi, Kanagawa (JP); Tsugio Okudaira, Tokyo (JP); Masumi Suetsugu, Toyonaka (JP); Yasunori Uetani, Toyonaka (JP); Katsuhiko Namba, Hirakata (JP)

(73) Assignees: Sumitomo Chemical Company, Limited, Osaka (JP); Kunihiro Ichimura, Kanagawa (JP)

( * ) Notice: Subject to any disclaimer, the term of this patent is extended or adjusted under 35 U.S.C. 154(b) by 131 days.

(21) Appl. No.: 10/107,488

(22) Filed: Mar. 28, 2002

(65) Prior Publication Data

US 2003/0013038 A1 Jan. 16, 2003

(30) Foreign Application Priority Data

Mar. 28, 2001 (JP) ....................... 2001-092325

(51) Int. Cl.$^7$ ............................... G03F 7/038
(52) U.S. Cl. .................... 430/270.1; 430/905
(58) Field of Search ............... 430/270.1, 905

(56) References Cited

U.S. PATENT DOCUMENTS

| | | | |
|---|---|---|---|
| 5,159,057 A | * 10/1992 | Perry | ............ 528/391 |
| 5,968,713 A | 10/1999 | Nozaki et al. | |
| 6,303,264 B1 | 10/2001 | Fujie et al. | |

FOREIGN PATENT DOCUMENTS

| | | |
|---|---|---|
| JP | 04 070381 A | 3/1992 |
| JP | 2577417 B2 | 11/1996 |
| JP | 2994048 B2 | 10/1999 |

* cited by examiner

*Primary Examiner*—Janet Baxter
*Assistant Examiner*—Yvette C. Thornton
(74) *Attorney, Agent, or Firm*—Birch, Stewart, Kolasch & Birch, LLP

(57) ABSTRACT

A chemical amplification type positive resist composition that enables a resist pattern free from deformation in a side wall thereof and excellent in evenness and is excellent in sensitivity as well as resolution is provided and the chemical amplification type positive resist composition comprises a resin which has a polymerization unit derived from p-hydroxystyrene and a polymerization unit having a group unstable against acid, and is insoluble or hardly soluble in an alkaline medium itself but becoming alkaline-soluble after the acid-unstable group being cleaved by the action of the generated acid; an acid generating agent; and a compound represented by the following formula (I):

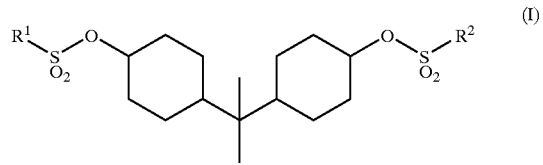

wherein $R^1$ and $R^2$ each independently represents an alkyl group having 1 to 15 carbon atoms, an alkyl group having 1 to 8 carbon atoms wherein at least 3 hydrogen atoms are substituted by fluorine atoms, or an aryl group having 6 to 10 carbon atoms.

5 Claims, No Drawings

CHEMICAL AMPLIFICATION TYPE POSITIVE RESIST COMPOSITION

BACKGROUND OF THE INVENTION

The present invention relates to a chemical amplification type positive photo resist composition to be used for fine processing of semiconductors.

In recent years, with high degree of integration for integrated circuits, demands for a fine pattern in submicron order formed with high precision have been increased. Under the circumstances, excimer laser lithography has been marked since it enables the production of 64M DRAM and 1 G DRAM. A chemical amplification type resist that takes advantage of the chemical amplification effect of acid catalysts is being adopted as a resist suitable for such excimer laser lithography process. In the chemical amplification type resist, acid generated from an acid generating agent at a irradiation-exposed portion under exposure to radiation behaves as a catalyst in a reaction caused by a subsequent heat treatment (post exposure bake; hereinafter sometimes abbreviated as "PEB") to change solubility of the irradiation-exposed portion in an alkali developer, thereby providing a positive or a negative pattern.

Since such resist is required to exhibit a high resolution, a composition for the resist typically has a high transparency at the exposure wavelength. The resist typically used for KrF excimer laser lithography is a poly(p-hydroxystyrene) based resin wherein a part of the phenolic hydroxyl group is protected by a group cleavable due to the action of an acid. However, there has been raised a problem that the application of the resist with high transparency to a substrate without low reflectance ratio at a resist/substrate interface leads to a generation of standing wave in a resist layer, and a side wall of a resulting fine pattern formed from the resist layer has a wavy form. Since a form of the sidewall of fine pattern affects on a precision of fine processing, it is desired that the sidewall be evenly formed.

An object of the present invention is to provide a chemical amplification type positive resist composition that enables a resist pattern free from deformation in a side wall thereof and excellent in evenness, and is excellent in sensitivity as well as resolution and suitable for lithography using excimer laser beams such as Krf.

SUMMARY OF THE INVENTION

The present inventors have conducted intensive studies for attaining the above object, and have found that excellent capabilities are achieved by mixing a specific compound with a positive resist composition comprising a resin that can become soluble in an alkaline medium and an acid generating agent. The inventors have accomplished the present invention based on the finding and extensive researches.

More specifically, the present invention provides a chemical amplification type positive resist composition comprising a resin which has a polymerization unit derived from p-hydroxystyrene and a polymerization unit having a group unstable against acid, and is insoluble or hardly soluble in an alkaline medium itself but becoming alkaline-soluble after the acid-unstable group being cleaved by the action of the generated acid (hereinafter, the resin will be sometimes referred to as "resin that can become alkaline-soluble"); an acid generating agent; and at least one compound selected from compounds represented by the following formula (I).

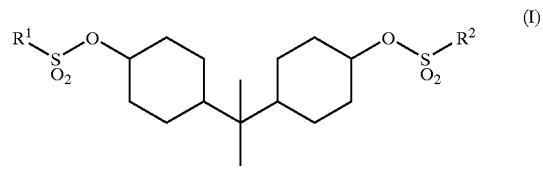

wherein $R^1$ and $R^2$ each independently represents an alkyl group having 1 to 15 carbon atoms, an alkyl group having 1 to 8 carbon atoms wherein at least 3 hydrogen atoms are substituted by fluorine atoms, or an aryl group having 6 to 10 carbon atoms.

DESCRIPTION OF THE EMBODIMENTS

The composition of the present invention is characterized in containing a resin that can become alkaline-soluble, a radiation-sensitive acid generating agent and at least one of the compounds represented by the above formula (I). The compounds represented by the formula (I) may be used alone or in combination of two or more. The composition of the present invention achieves the effect of improving pattern form and evenness by using the specific compound(s) without deteriorating sensitivity and resolution.

In the formula (I), $R^1$ and $R^2$ each independently represent an alkyl group having 1 to 15 carbon atoms, an alkyl group having 1 to 8 carbon atoms wherein at least 3 hydrogen atoms are substituted by fluorine atoms, or an aryl group having 6 to 10 carbon atoms.

Specific examples of the compounds represented by the formula (I) include the following compounds.

(IVa)

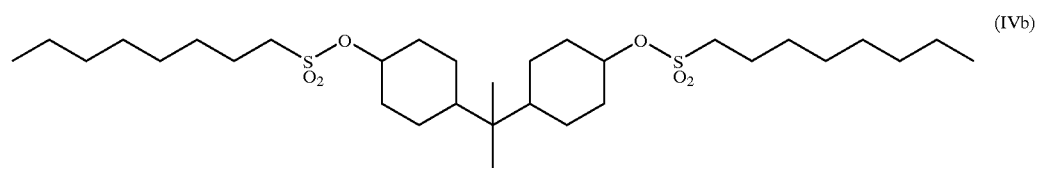

(IVb)

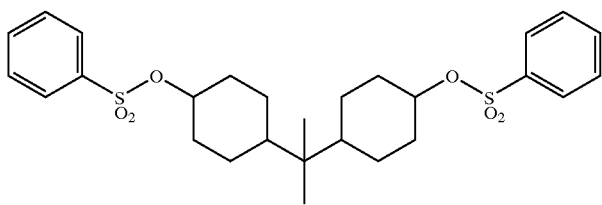
(IVc)

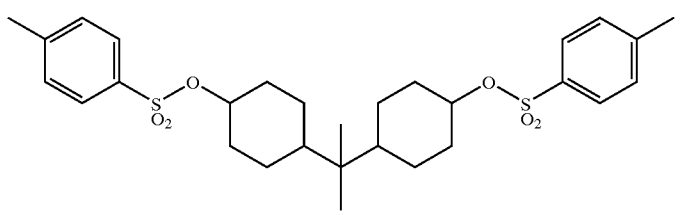
(IVd)

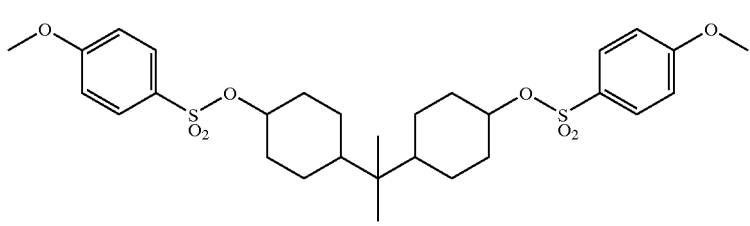
(IVe)

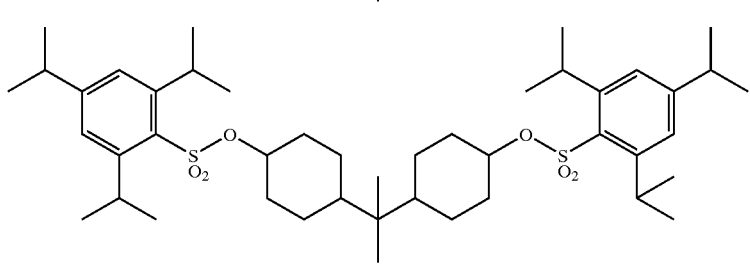
(IVf)

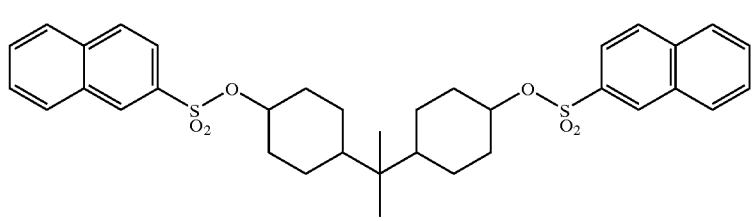
(IVg)

The chemical amplification type resist composition of the present invention contains, in addition to at least one of the compounds represented by the formula (I), comprises a resin that can become alkaline-soluble as a binder component and an active compound that generates an acid by irradiation as a radiation-sensitive component. It takes advantage of catalysis of the acid generated from the irradiation-sensitive component at a irradiation beam-exposed portion. Generally, in a chemical amplification type positive resist, acid generated at a radiation beam-exposed portion is diffused by subsequent thermal treatment (post exposure bake) to cause cleavage of a protecting group in the resin or the like as well as to regenerate acid, thereby making the irradiation-exposed portion alkaline-soluble. The resin used as the binder component in the present invention is a binder resin that has a protecting group capable of being cleaved by acid, and originally is insoluble or hardly soluble in alkaline medium itself but becomes alkaline-soluble after the protecting group has been cleaved by the action of an acid.

Examples of the resin that has the protecting group capable of being cleaved by the action of an acid and originally is insoluble or hardly soluble in alkaline medium itself but becomes alkaline-soluble after the protecting group has been cleaved by the action of an acid may be: a polyvinylphenol resin; a polyisopropenylphenol resin; a resin in which a hydroxy group of the polyvinylphenol resin or the polyisopropenylphenol resin is partly converted to form an alkylether; a resin prepared by introducing a protecting group capable of being cleaved by the action of an acid into a resin having a phenol skeleton, such as a copolymer of vinylphenol or isopropenylphenol and other polymeric unsaturated compounds; a resin prepared by introducing a protecting group capable of being cleaved by the action of an acid to an alkaline-soluble resin such as those having a (meth)acrylic acid skeleton and the like.

Examples of the group having dissolution inhibiting capability against an alkaline developer but unstable against acid include: a group with its quaternary carbon bound to an oxygen atom such as tert-butyl, tert-butoxycarbonyl or tert-butoxycarbonylmethyl; an acetal group such as tetrahydro-2-pyranyl, tetrahydro-2-furyl, 1-ethoxyethyl, 1-(2-methylpropoxy)ethyl, 1-(2-methoxyethoxy)ethyl, 1-(2- acetoxyethoxy)ethyl, 1-{2-(1-adamantyloxyl)ethoxy}ethyl or 1-{2-(1-adamantanecarbonyloxy)ethoxy}ethyl; or a residue of a non-aromatic cyclic compound such as 3-oxocyclohexyl, 4-methyltetrahydro-2-pyrrone-4-yl (derived from mevalonic lactone), 2-methyl-2-adamantyl or 2-ethyl-2-adamantyl.

The groups described above will substitute hydrogen of the phenolic hydroxyl group or the carboxyl group.

The protecting group can be introduced into the alkaline-soluble resin having a phenolic hydroxyl group or a carboxyl group by a reaction for introducing the protecting group employing a known esterifying reaction. Alternatively, the resin may be obtained by copolymerization using an unsaturated compound having such group as a monomer Preferred examples of the polymerization unit having a group unstable against acid include a polymerization unit represented by the following formula (II):

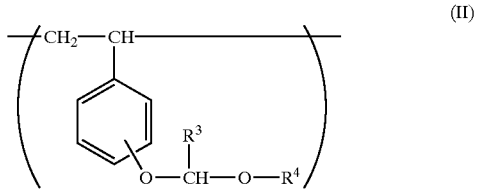

(II)

wherein $R^3$ represents an alkyl group having 1 to 4 carbon atoms, and $R^4$ represents an alkyl group having 1 to 6 carbon atoms or a cycloalkyl group having 5 to 7 carbon atoms, or $R^3$ and $R^4$ may be combined to form a tetramethylene chain.

Further, examples of the polymerization unit having a group unstable against acid include a polymerization unit represented by one of the following formulas (IIIa), (IIIb) and (IIIc):

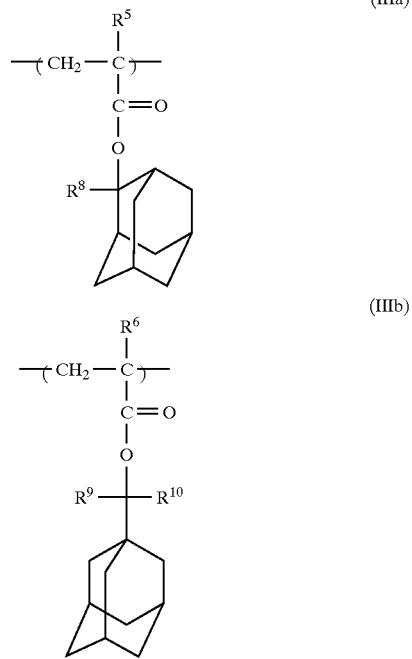

(IIIa)

(IIIb)

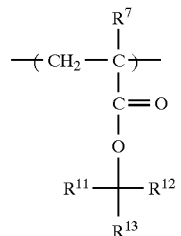

(IIIc)

wherein, $R^5$ to $R^7$ each independently represents hydrogen atom or methyl, and $R^8$ to $R^{13}$ each independently represents an alkyl group having 1 to 8 carbon atoms.

The acid generating agent, another component of the present invention, may be a compound which is decomposed to generate an acid by applying a radiation on the substance itself or on a resist composition containing the substance.

Such radiation sensitive acid generating agents, for example, include onium salt compounds, organno-halogenated alkyl triazine type, disulfone compounds, compounds having diazomethanesulfonyl skeleton, sulfonate compounds, and the like.

Specific examples thereof include;
diphenyliodonium trifluoromethanesulfonate,
4-methoxyphenylphenyliodonium hexafluoroantimonate,
4-methoxyphenylphenyliodonium trifluoromethanesulfonate,
bis(4-tert-butylphenyl)iodonium tetrafluoroborate,
bis(4-tert-butylphenyl)iodonium hexafluorophosphate,
bis(4-tert-butylphenyl)iodonium hexafluoroantimonate,
bis(4-tert-butylphenyl)iodonium trifluoromethanesulfonate,
triphenylsulfonium hexafluorophosphate,
triphenylsulfonium hexafluoroantimonate,
triphenylsulfonium trifluoromethanesulfonate,
4-methoxyphenyldiphenylsulfonium hexafluoroantimonate,
4-methoxyphenyldiphenylsulfonium trifluoromethanesulfonate,
p-tolyldiphenylsulfonium trifluoromethanesulfonate,
p-tolyldiphenylsulfonium perfluorobutanesulfonate,
p-tolyldiphenylsulfonium perfluorooctanesulfonate,
2,4,6-trimethylphenyldiphenylsulfonium trifluoromethanesulfonate,
4-tert-butylphenyldiphenylsulfonium trifluoromethanesulfonate,
4-phenylthiophenyldiphenylsulfonium hexafluorophosphate,
4-phenylthiophenyldiphenylsulfonium hexafluoroantimonate,
1-(2-naphthoylmethyl)thiolanium hexafluoroantimonate,
1-(2-naphthoylmethyl)thiolanium trifluoromethanesulfonate,
4-hydroxy-1-naphthyldimethylsulfonium hexafluoroantimonate,
4-hydroxy-1-naphthyldimethylsulfonium trifluoromethanesulfonate,
cyclohexylmethyl(2-oxocyclohexyl)sulfonium trifluoromethanesulfonate,
cyclohexylmethyl(2-oxocyclohexyl)sulfonium perfluorobutanesulfonate,
cyclohexylmethyl(2-oxocyclohexyl)sulfonium perfluorooctanesulfonate,
2-methyl-4,6-bis(trichloromethyl)-1,3,5-triazine,
2,4,6-tris(trichloromethyl)-1,3,5-triazine,
2-phenyl-4,6-bis(trichloromethyl)-1,3,5-triazine,
2-(4-chlorophenyl)-4,6-bis(trichloromethyl)-1,3,5-triazine, 2-(4-methoxyphenyl)-4,6-bis(trichloromethyl)-1,3,5-triazine,
2-(4-methoxy-1-naphthyl)-4,6-bis(trichloromethyl)-1,3,5-triazine,
2-(benzo[d][1,3]dioxolane-5-yl)-4,6-bis(trichloromethyl)-1,3,5-triazine,
2-(4-methoxystryl)-4,6-bis(trichloromethyl)-1,3,5-triazine,
2-(3,4,5-trimethoxystyryl)-4,6-bis(trichloromethyl)-1,3,5-triazine,
2-(3,4-dimethoxystyryl)-4,6-bis(trichloromethyl)-1,3,5-triazine,
2-(2,4-dimethoxystyryl)-4,6-bis(trichloromethyl)-1,3,5-triazine,
2-(2-methoxystyryl)-4,6-bis(trichloromethyl)-1,3,5-triazine,
2-(4-butoxystyryl)-4,6-bis(trichloromethyl)-1,3,5-triazine,
2-(4-pentyloxystyryl)-4,6-bis(trichloromethyl)-1,3,5-triazine,
diphenyl disulfone,
di-p-tolyl disulfone,
bis(phenylsulfonyl)diazomethane,
bis(4-chlorophenylsulfonyl)diazomethane,
bis(p-tolylsulfonyl)diazomethane,
bis(4-tert-butylphenylsufonyl)diazomethane,
bis(2,4-xylylsulfonyl)diazomethane,
bis(cyclohexylsulfonyl)diazomethane,
(benzoyl)(phenylsulfonyl)diazomethane,
1-benzoyl-1-phenylmethyl p-toluenesulfonate (so-called benzointosylate),
2-benzoyl-2-hydroxy-2-phenylethyl p-toluenesulfonate (so-called α-methylolbenzointosylate),
1,2,3-benzenetriyl trimethanesulfonate,
2,6-dinitrobenzyl p-toluenesulfonate,
2-nitrobenzyl p-toluenesulfonate,
4-nitrobenzyl p-toluenesulfonate,
N-(phenylsulfonyloxy)succinimide,
N-(trifluoromethylsulfonyloxy)succinimide,
N-(trifluoromethylsulfonyloxy)phthalimide,
N-(trifluoromethylsulfonyloxy)-5-norbornene-2,3-dicarboxyimide,
N-(trifluoromethylsulfonyloxy)naphthalimide,
N-(10-camphorsulfonyloxy)naphthalimide, and the like.

In order to prevent deterioration in capabilities caused by deactivation of acid associated with leaving after exposure, the chemical amplifying type resist composition of the present invention further comprises basic compound(s), especially basic nitrogen-containing organic compounds such as amines as quenchers. Concrete examples of the basic compounds to be used as quenchers include those represented by the following formulas;

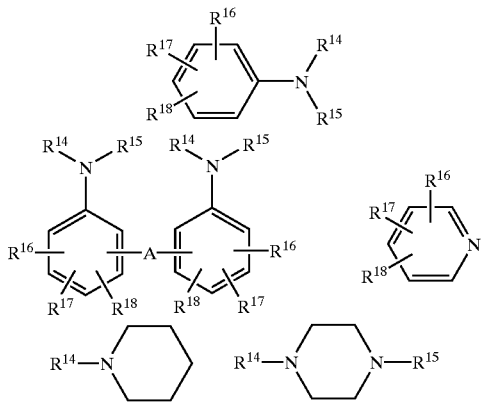

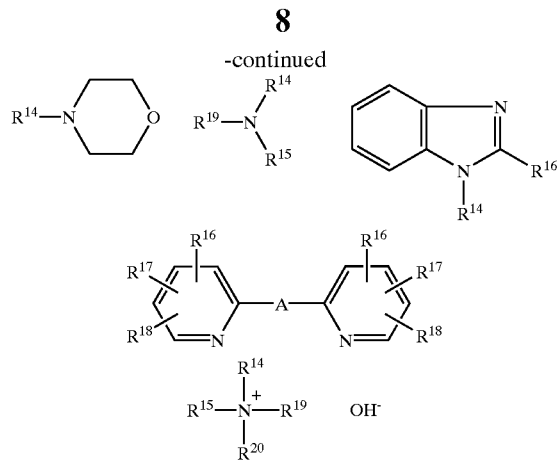

In the above formulas, $R^{14}$, $R^{15}$ and $R^{20}$ each independently represents hydrogen atom, alkyl group, cycloalkyl or aryl group. The alkyl group, cycloalkyl or aryl may respectively be unsubstituted or substituted with a hydroxyl group, an amino group or an alkoxy group having 1 to 6 carbon atoms. The amino group may be substituted with an alkyl group having 1 to 4 carbon atoms. The alkyl may preferably have about 1 to 6 carbon atoms; the cycloalkyl group may preferably have about 5 to 10 carbon atoms; and the aryl group may preferably have about 6 to 10 carbon atoms.

$R^{16}$, $R^{17}$ and $R^{18}$ each independently represents hydrogen atom, alkyl group, cycloalkyl group, aryl or alkoxy group. The alkyl group, cycloalkyl group, aryl or alkoxy group may respectively be unsubstituted or substituted with a hydroxyl group, an amino group or an alkoxy group having 1 to 6 carbon atoms. The amino group may be substituted with an alkyl group having 1 to 4 carbon atoms. The alkyl may preferably have about 1 to 6 carbon atoms; the cycloalkyl group may preferably have about 5 to 10 carbon atoms, the aryl group may preferably have about 6 to 10 carbon atoms; and the alkoxy group may preferably have about 1 to 6 carbon atoms.

$R^{19}$ represents alkyl or cycloalkyl group. The alkyl or cycloalkyl group may respectively be unsubstituted or substituted with a hydroxyl group, an amino group or an alkoxy group having 1 to 6 carbon atoms. The amino group may be unsubstituted or substituted with an alkyl group having 1 to 4 carbon atoms. The alkyl group may preferably have about 1 to 6 carbon atoms, and the cycloalkyl may preferably have about 5 to 10 carbon atoms.

A represents alkylene, carbonyl, imino, sulfide or disulfide. The alkylene may preferably have about 2 to 6 carbon atoms.

The groups represented by one of $R^{14}$ to $R^{20}$ may be straight chain or branched if the groups can take both structure.

Specific examples of the compounds of above formulas include hexylamine, heptylamine, octylamine, nonylamine, decylamine, aniline, 2-, 3- or 4-methylaniline, 40nitroaniline, 1- or 2-naphtylamine, ethylenediamine, tetramethylenediamine, hexamethylenediamine, 4,4'-diamino-1,2-diphenylethane, 4,4'-diamino-3,3'-dimethyldiphenylmethane, 4,4'-diamino-3,3'-diethyldiphenylmethane, dibutylamine, dipentylamine, dihexylamine, diheptylamine, dioctylamine, dinonylamine, didecylamine, N-methylaniline, peperidine, diphenylamine, triethylamine, trimethylamine, tripropylamine, tributylamine, tripentylamine, trihexylamine, triheptylamine, trioctylamine, trinonylamine, tridecylamine, methyldibutylamine, methyldipentylamine, methyldihexylamine, methyldicyclohexylamine, methyldiheptylamine, methyldioctylamine, methyldinonylamine, methyldidecylamine, ethyldibutylamine, ethyldipentylamine, ethyldihexylamine, ethyldiheptylamine, ethyldioctylamine, ethyldinonylamine, ethyldidecylamine, dicyclohexylmethylamine, tris{2-(2-methoxyethoxy)ethyl}amine, triisopropanolamine, N,N-dimethylaniline, 2,6-isopropylaniline, imidazole, pyridine, 4-methylpyridine, 4-methylimidazole, bipyridine, 2,2-dipyridylamine, di-2-pyridylketone, 1,2-di(2-pyridyl)ethane, 1,2-di(4-pyridyl)ethane, 1,3-di(4-pyridyl)propane, 1,2-bis(2-pyridyloxy)ethylene, 1,2-bis(4-pyridyl)ethylene, 1,2-bis(4-pyridyloxy)ethane, 4,4-dipyridylsulfide, 4,4-dipyridyldisulfide, 1,2-bis(4-pyridyl)ethylene, 2,2'-dipicorylamine, 3,3'-dipicorylamine, tetramethylammonium hydroxide, tetraisopropylammonium hydroxide, tetrabutylammonium hydroxide and the like.

The resist composition of the present invention may preferably comprise from about 0.3 to about 30 parts by weight of the acid generating agent and from about 0.01 to about 10 parts by weight, more preferably from about 0.1 to about 3 parts by weight, of the compound (s) of the formula (I) base on 100 parts by weight of the resin that can become alkali-soluble.

In the case where the basic compound is used as a quencher, the composition of the present invention may preferably comprises from about 0.001 to about 5 parts by weight, more preferably from about 0.01 to about 1 part by weight, of the basic compound based on 100 parts by weight of the resin that can become alkaline-soluble.

The composition may also comprises, if required, a small amount of various additives such as sensitizers, dissolution inhibitors, resins other than the above resin, surfactants, stabilizers, and dyes so far as the objects of the present invention is not impaired.

The resist composition of the present invention generally becomes a resist solution in the state in which the above-described components are dissolved in a solvent to be applied on a substrate such as a silicon wafer. The solvent herein used may be one which dissolves each component, has an appropriate drying rate, and provides a uniform and smooth coating after evaporation of the solvent, and can be one which is generally used in this field.

Examples thereof include glycol ether esters such as ethylcellosolve acetate, methylcellosolve acetate, and propylene glycol monomethyl ether acetate; esters such as ethyl lactate, butyl acetate, amyl acetate, and ethyl pyruvate; ketones such as acetone, methyl isobutyl ketone, 2-heptanone, and cyclohexanone; and cyclic esters such as γ-butyrolactone. These solvents can be used alone or in combination of two or more thereof.

The resist film applied on a substrate, and dried is subjected to an exposure treatment for patterning. Then, after a heat-treatment for promoting a protecting deblocking reaction, development by an alkali developer is conducted. The alkali developer herein used can be various kinds of alkaline aqueous solutions used in this field. In general, an aqueous solution of tetramethylammoniumhydroxide or (2-hydroxyethyl) trimethylammoniumhydroxide (so-called colline) is often used.

The present invention will be described in more detail by way of examples, which should not be construed as limiting the scope of the present invention. All "%" and parts for representing content or used amount in examples are by weight unless otherwise stated. The weight-average molecular weight (Mw) or degree of dispersion (Mw/Mn) is a value determined from gel permeation chromatography using polystyrene as a reference standard.

REFERENCE EXAMPLE 1

Synthesis of Poly(p-1-ethoxyethoxystyrene/p-hydroxystyrene)

A flask was charged with poly(p-hydroxystyrene) (108.3 g as a methylisobutylketone solution containing 30.0 g of (poly(p-hydroxystyrene) having a weight average molecular weight of about 15,200 and degree of dispersion of 1.20), 0.005 g of p-toluene sulfonate and 102 g of methylisobutylketone and then stirred. To the resin solution, 8.7 g of ethylvinylether (0.12 mol, 0.48 equivalent with respect to a hydroxyl group of poly(p-hydroxystyrene)) was dropped using a dropping funnel. After stirring for 3 hours at a temperature of 25° C., the mixture was added with 15 g of methylisobutylketone and 57 g of ion exchanged water and was separated to obtain an organic layer. Then, the organic layer was washed with 57 g of ion-exchanged water for four times to be separated.

After distilling the solvent off from the organic layer to concentrate the organic layer, 306 g of propyleneglycol-monomethyletheracetate was added thereto to further distill the solvent off, thereby substituting the solvent. Thus, 125 g of a resin solution in propyleneglycolmonomethyl-etheracetate was obtained. Solid content of the resin solution determined by heating weight loss method was 30.1%. Also, a proportion of 1-ethoxyethylated hydroxy groups in poly (p-hydroxystyrene was 35.7%. This resin will be referred to as "resin A1".

REFERENCE EXAMPLE 2

Except for changing the amount of ehtylvinylether to be used, a resin was obtained in the same manner as in Reference Example 1. Solid content of a resin solution obtained was 30.2%, and a proportion of 1-ethoxyethylated hydroxy groups in poly(p-hydroxystyrene) was 28.7%. This resin will be referred to as "resin A2".

REFERENCE EXAMPLE 3

Synthesis of 2-ethyl-2-adamantyl Methacrylate/p-acetoxystyrene (20:80) Copolymer A flask was charged with 39.7 g (0.16 mol) of 2-ethyl-2-adamantyl methacrylate, 103.8 g (0.64 mol) of p-acetoxystyrene and 265 g of isopropanol, and the mixture was heated to 75° C. under the nitrogen atmosphere. To the obtained solution was dropped a solution prepared by dissolving 11.05 g (0.048 mol) of dimethyl 2,2'-azobis(2-methylpropionate) into 22.11 g of isopropanol. After keeping the solution for about 0.3 hour at a temperature of 75° C. and then with stirring for 12 hours, the solution was diluted with acetone, and then the reaction solution was poured into a large amount of methanol to have a polymer precipitated, followed by filtration. Amount of thus obtained copolymer of 2-ethyl-2-adamantyl methacrylate and p-acetoxystyrene was 250 g (note: that this is a weight of a wet cake containing methanol).

REFERENCE EXAMPLE 4

Synthesis of 2-ethyl-2-adamantyl Methacrylate/p-hydroxystyrene (20:80) Copolymer A flask was charged with 250 g of the 2-ethyl-2-adamantyl methacrylate/p-acetoxystyrene (20:80) copolymer obtained in Reference Example 3, 10.3 g (0,084 mol) of 4-dimethylaminopyridine and 202 g of methanol, and the mixture was kept for 20 hours with stirring under reflux. After cooling, the reaction solution was neutralized with 7.6 g (0.126 mol) of glacial-acetic acid, followed by pouring into a large amount of water to obtain a precipitate. The polymer (the precipitate) thus obtained was filtered and then dissolved into acetone. An operation of pouring the solution into a large amount of water was repeated for three times to obtain a precipitate and purify the same. Amount of the obtained copolymer of 2-ethyl-2-adamantyl methacrylate and p-hydroxystyrene was 95.9 g. Also, the polymer has a weight average molecular weight of about 8,600 and a degree of dispersion of 1.65, and a copolymerization ratio thereof was determined to be about 20:80 using a nuclear magnetic resonance (13C-NMR) spectrometer. This resin will be referred to as "resin B1".

REFERENCE EXAMPLE 5

Synthesis of 2-ethyl-2-adamantyl Methacrylate and P-acetoxystyrene (30:70) Copolymer A flask was charged with 59.6 g (0.24 mol) of 2-ethyl-2-adamantyl methacrylate, 90.8 g (0.56 mol) of p-acetoxystyrene and 279 g of isopropanol, and the mixture was heated to 75° C. under the nitrogen atmosphere. To the obtained solution was dropped a solution prepared by dissolving 11.05 g (0.048 mol) of dimethyl 2,2'-azobis(2-methylpropionate) into 22.11 g of isopropanol. After keeping the mixture for about 0.3 hour at a temperature of 75° C. and then with stirring for 12 hours, the mixture was diluted with acetone. Then the reaction solution was poured into a large amount of methanol to have a polymer precipitated, followed by filtration of the polymer. Amount of thus obtained copolymer of 2-ethyl-2-adamantyl methacrylate and p-acetoxystyrene was 250 g (note: this is a weight of a wet cake containing methanol).

REFERENCE EXAMPLE 6

Synthesis of 2-ethyl-2-adamantyl Methacrylate/p-acetoxystyrene (30:70) Copolymer A flask was charged with 250 g of the 2-ethyl-2-adamantyl methacrylate/p-acetoxystyrene (30:70) copolymer obtained in Reference Example 5, 10.8 g (0.088 mol) of 4-dimethylaminopyridine and 239 g of methanol, and the mixture was kept for 20 hours under reflux. After cooling, the reaction solution was neutralized with 8.0 g (0.133 mol) of glacial acetic acid, and then poured into a large amount of water to obtain a precipitate. The polymer (the precipitate) thus obtained was filtered and then dissolved into acetone. An operation of pouring the solution into a large amount of water was repeated for three times to obtain a precipitate and purify the same. Amount of the obtained copolymer crystal of 2-ethyl-2-adamantyl methacrylate and p-hydroxystyrene was 102.8 g. Also, the polymer has a weight average molecular weight of about 8,200 and a degree of dispersion of 1.68, and a copolymerization ratio thereof was determined to be about 30:70 using a nuclear magnetic resonance (13C-NMR) spectrometer. This resin will be referred to as "resin B2".

EXAMPLES 1 to 2 AND COMPARATIVE EXAMPLE 1

The following components were mixed and dissolved, and then filtered though a filter made of fluorine resin having a diameter of 0.2 im, thereby obtaining a resist solution.

| | |
|---|---|
| Resin: | |
| resin A1 (solid content) | 18.52 parts |
| resin A2 (solid content) | 81.48 parts |
| Acid generating agent: | |
| bis(cyclohexylsulfonyl)diazomethane | 2.96 parts |
| triphenylsulfonium 2,4,6-triisopropylbenzenesulfonate | 0.37 part |
| Quencher: | |
| dicyclohexylmethylamine | 0.13 part |
| tris{2-(2-methoxyethoxy)ethyl}amine | 0.13 part |
| Added Compound: | |
| types and amounts thereof are shown in Table 1 | |
| Solvent: | |
| Propyleneglycolmonomethyletheracetate | 407.41 parts |

*Amount of solvents includes that of resin solution.

Symbols indicated in the column of "added compound" in Table 1 and Table 2 respectively mean the following compounds.

C1: compound of the formula (IV d)
C2: compound of the formula (IV b)

Each of the resist solutions is applied on a silicon wafer by conventional spin coating, and then pre-bake was performed on a proximity hotplate under the conditions of 100° C. and 60 seconds, to form a resist film having a thickness of 0.7 im. Each of the wafers on which the resist film was formed was subjected to exposure using KrF excimer stepper ("NSR S203B" manufactured by Nikon Co., Ltd., NA=0.68, σ=0.75, ordinary light exposure) by way of masks of various forms and dimensions. Next, PEB was performed on a hotplate under the conditions of 110° C. and 60 seconds, followed by paddle-development of 60 seconds using a 2.38% tetramethylammonium hydroxide solution. A cross section of the pattern after the development was examined using a scanning electron microscope to evaluate sensitivity, resolution and form of the pattern according to the method below. Results thus obtained are shown in Table 1.

Effective Sensitivity: Indicated by the exposure amount that 0.30 im line and space pattern becomes 1:1.

Resolution: Indicated by the minimum dimension of line and space pattern that is resolved at the exposure amount of the effective sensitivity.

Form: Forms and evenness of a cross section of a pattern were observed, and a pattern side wall with which a, distinct wavy form was observed is indicated as "X", a pattern side wall with which no wavy form was observed is indicated as "◉", and a pattern side wall which was intermediate of the above pattern side walls and with which a wavy impression was observed is indicated as "○".

TABLE 1

| No. | Added compound/ Amount | Effective Sensitivity mj/cm² | Resolution im | Form |
|---|---|---|---|---|
| Example 1 | C1 0.37 part | 18 | 0.18 | ◉ |
| Example 2 | C2/ 0.37 part | 22 | 0.18 | ○ |
| Comparative Example 1 | none | 25 | 0.18 | X |

EXAMPLE 3 AND COMPARATIVE EXAMPLE 2

The following components were mixed and dissolved, and then filtered though a filter made of fluorine resin having a diameter of 0.2 im, thereby obtaining a resist solution.

| Resin: | |
| --- | --- |
| resin B1 (solid content) | 50.00 parts |
| resin B2 (solid content) | 50.00 parts |
| Acid generating agent: | |
| bis(tert-butylsulfonyl)diazomethane | 3.33 parts |
| triphenylsulfonium 2,4,6-triisopropylbenzenesulfonate | 3.33 part |
| Quencher: | |
| 2,6-diisopropylaniline | 0.41 part |
| Added Compound: | |
| types and amounts thereof are shown in Table 2 | |
| Solvent: | |
| Propyleneglycolmonomethyletheracetate | 666.67 parts |

*Amount of solvents includes that of resin solution.

On a silicon wafer, anti-reflective layer (DUV-44 manufactured by Nissan Chemical Co., Ltd.) was coated under the pre-baking conditions of 215° C. and 60 seconds so that the thickness became 0.1 im, which is such a thickness reflection presents at the resist/anti-reflective layer interface.

Each of the resist solutions is applied on the silicon wafer obtained above by conventional spin coating, and then pre-bake was performed on a proximity hotplate under the conditions of 100° C. and 60 seconds, to form a resist film having a thickness of 0.7 im. Each of the wafers on which the resist film was formed was subjected to exposure using KrF excimer stepper ("NSR S203B" manufactured by Nikon Co, Ltd., NA=0.68, σ=0.75, ordinary light exposure) by way of masks of various forms and dimensions. Next, PEB was performed on a hotplate under the conditions of 110° C. and 60 seconds, followed by paddle-development of 60 seconds using a 2.38% tetramethylammonium hydroxide solution. A cross section of the pattern after the development was examined using a scanning electron microscope to evaluate sensitivity, resolution and form of the pattern according to the method below. Results thus obtained are shown in Table 2.

Effective Sensitivity: Indicated by the exposure amount that 0.15 im line and space pattern becomes 1:1.

Resolution: the same method as in Example 1.

Form: the same method as in Example 1.

TABLE 2

| No. | Compound/ Amount | Effective Sensitivity mj/cm² | Resolution im | Form |
| --- | --- | --- | --- | --- |
| Example 3 | C1/ 0.74 part | 33 | 0.12 | ○ |
| Comparative Example 1 | none | 45 | 0.12 | X |

The chemical amplification type positive resist composition of the present invention enables a resist pattern free from deformation in a side well thereof and excellent in evenness, and is excellent in sensitivity as well as resolution. Further, it exhibits good resist performances such as film retention ratio, applicability and heat resistance. Accordingly, the chemical amplification type positive resist composition of the present invention is suitable for lithography using excimer laser beams such as Krf, and can form a fine resist pattern with precision.

What is claimed is:

1. A chemical amplification type positive resist composition comprising a resin which has a polymerization unit derived from p-hydroxystyrene and a polymerization unit having a group unstable against acid, and is insoluble or hardly soluble in an alkaline medium itself but becoming alkaline-soluble after the acid-unstable group being cleaved by the action of the generated acid;

an acid generating agent; and a compound represented by the following formula (I):

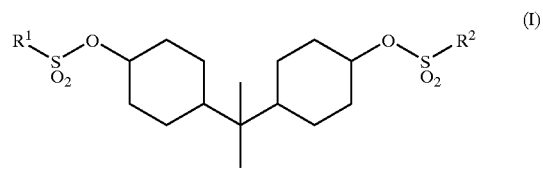

wherein $R^1$ and $R^2$ each independently represents an alkyl group having 1 to 15 carbon atoms, an alkyl group having 1 to 8 carbon atoms wherein at least 3 hydrogen atoms are substituted by fluorine atoms, or an aryl group having 6 to 10 carbon atoms.

2. The chemical amplification type positive resist composition according to claim 1 wherein the polymerization unit having a group unstable against acid is represented by following formula (II):

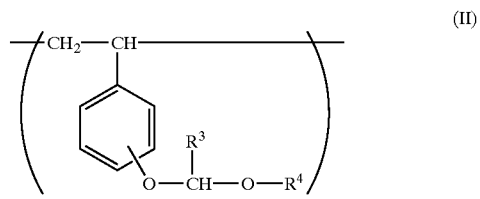

wherein $R^3$ represents an alkyl group having 1 to 4 carbon atoms, and $R^4$ represents an alkyl group having 1 to 6 carbon atoms or a cycloalkyl group having 5 to 7 carbon atoms, or $R^3$ and $R^4$ may be combined to form a tetramethylene chain.

3. The chemical amplification type positive resist composition according to claim 1 wherein the polymerization unit having a group unstable against acid is represented by one of the following formulas (IIIa), (IIIb) and (IIIc):

(IIIa) 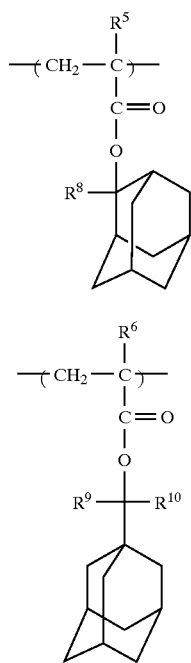

(IIIb) 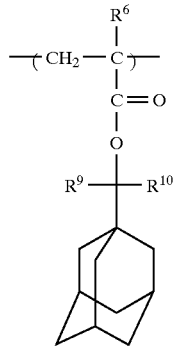

(IIIc) 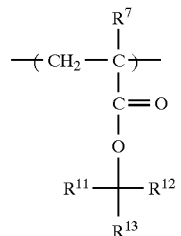

wherein, $R^5$ to $R^7$ each independently represents hydrogen atom or methyl, and $R^8$ to $R^{13}$ each independently represents alkyl group having 1 to 8 carbon atoms.

4. The chemical amplification type positive resist composition according to claim 1 which comprises from about 0.3 to about 30 parts by weight of the acid generating agent and from about 0.01 to about 10 parts by weight of the compound(s) of the formula (I) base on 100 parts by weight of the resin.

5. The chemical amplification type positive resist composition according to claim 1 which further comprises a basic compound.

* * * * *